United States Patent
Tsironis

(10) Patent No.: US 9,041,498 B1
(45) Date of Patent: May 26, 2015

(54) MECHANICALLY SHORT MULTI-CARRIAGE TUNER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 239 days.

(21) Appl. No.: 13/773,144

(22) Filed: Feb. 21, 2013

(51) Int. Cl.
    *H03H 7/40* (2006.01)
    *H03H 7/38* (2006.01)

(52) U.S. Cl.
    CPC .. *H03H 7/38* (2013.01); *H03H 7/40* (2013.01)

(58) Field of Classification Search
    USPC .................................. 333/263, 17.3, 32, 33
    See application file for complete search history.

(56) References Cited

U.S. PATENT DOCUMENTS

| | | | |
|---|---|---|---|
| 6,297,649 B1 | 10/2001 | Tsironis | |
| 6,674,293 B1 | 1/2004 | Tsironis | |
| 7,135,941 B1 | 11/2006 | Tsironis | |
| 7,646,267 B1 * | 1/2010 | Tsironis | 333/263 |

* cited by examiner

*Primary Examiner* — Stephen E Jones

(57) ABSTRACT

Mechanically short multi-carriage impedance tuners use meandering slabline structures. The meandering structure reduces the overall tuner length by a factor of 2.5 at 0.4 GHz. The critical issue of slabline bends is addressed with several low loss, low reflection alternatives. A preferred configuration comprises a vertical-horizontal slabline transition. Cable connections are discarded because of reflections and insertion loss. Measured results show acceptable performance. The tuner is mostly interesting for relatively lower microwave frequencies, such as 1 GHz.

20 Claims, 18 Drawing Sheets

Meandering slabline/tuner structure (top view)

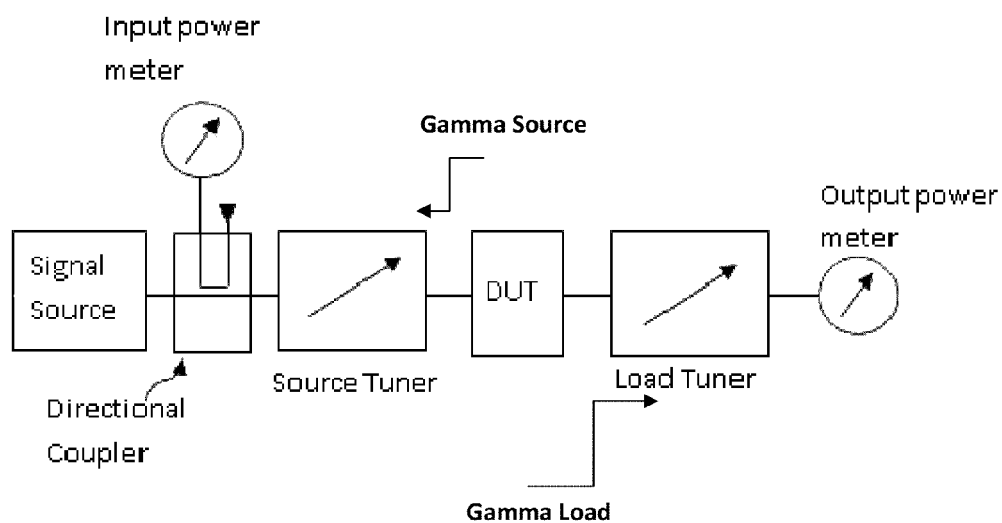
Figure 1: Prior art, Load Pull measurement setup

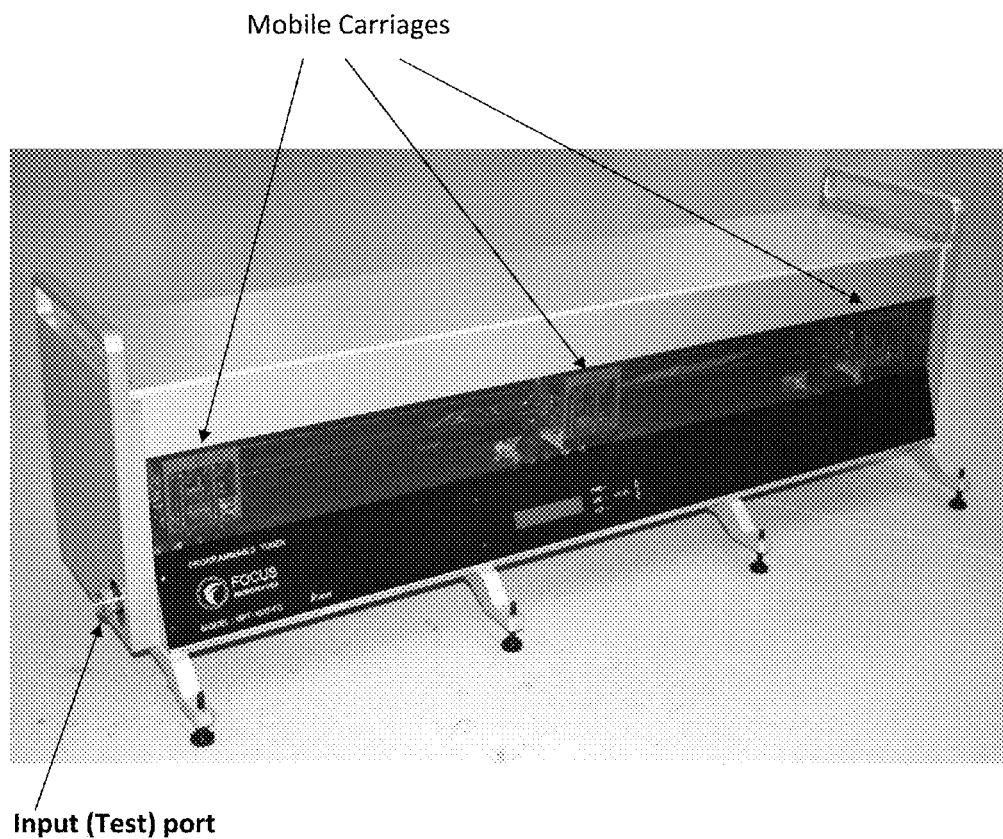
Figure 2: (prior art): actual three carriage (linear) harmonic tuner (Fmin=0.7GHz), total length 38" (96.5cm)

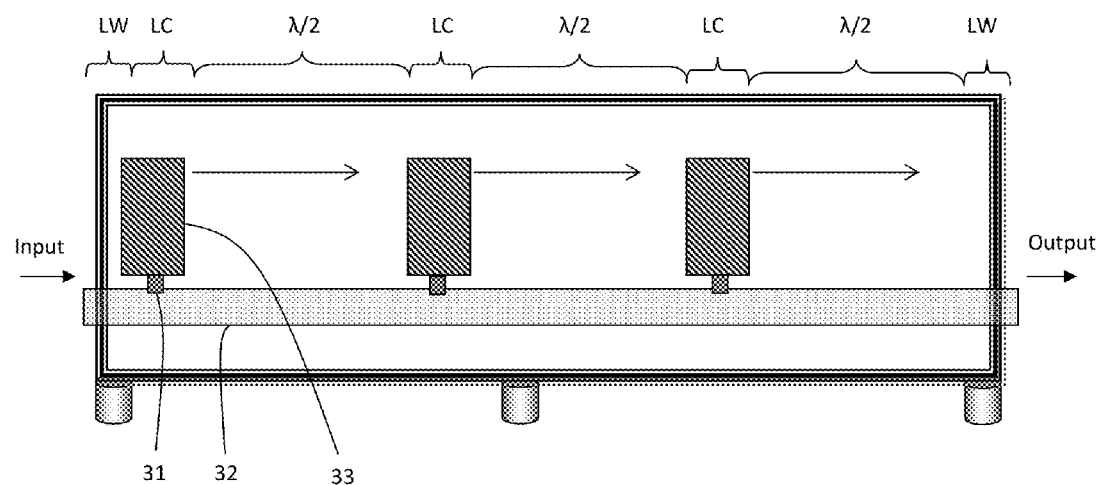
Figure 3 (prior art) Total length of three carriage tuner, LC=carriage, LW=wall

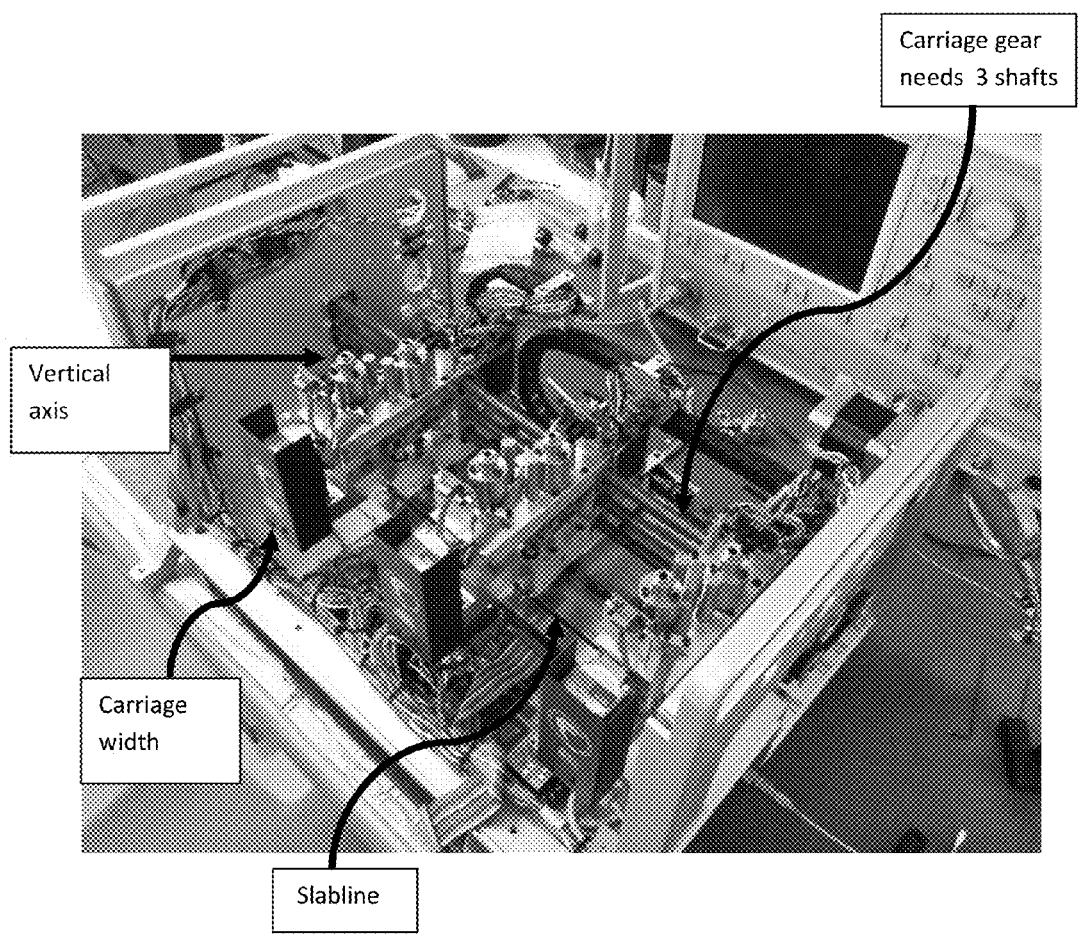
Figure 4 (prior art): actual three carriage tuner, minimum frequency = 4GHz.

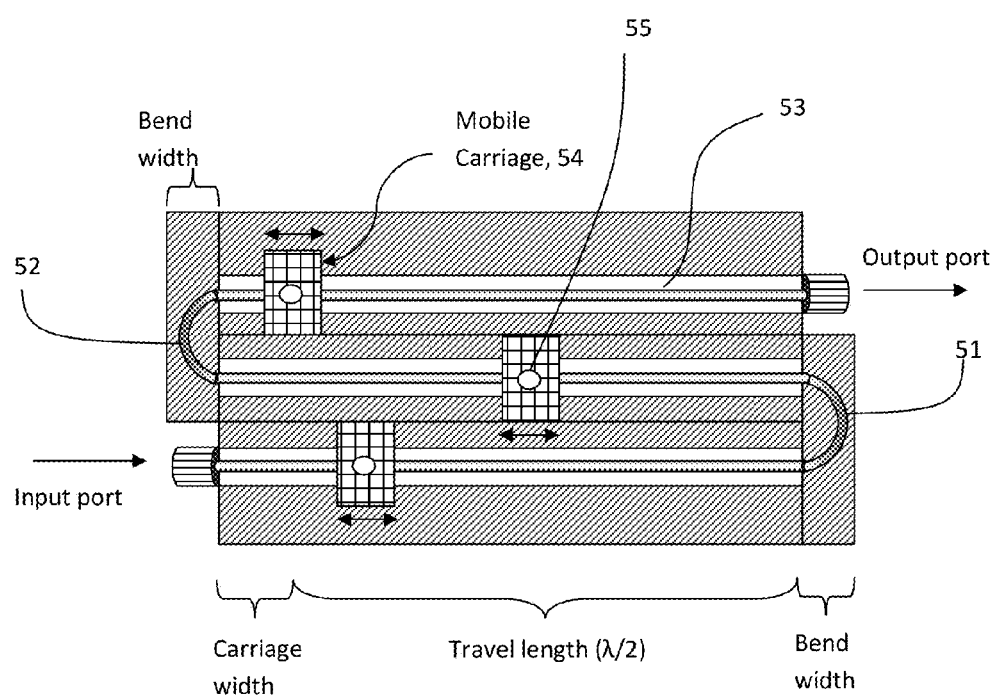
Figure 5: Meandering slabline/tuner structure (top view)

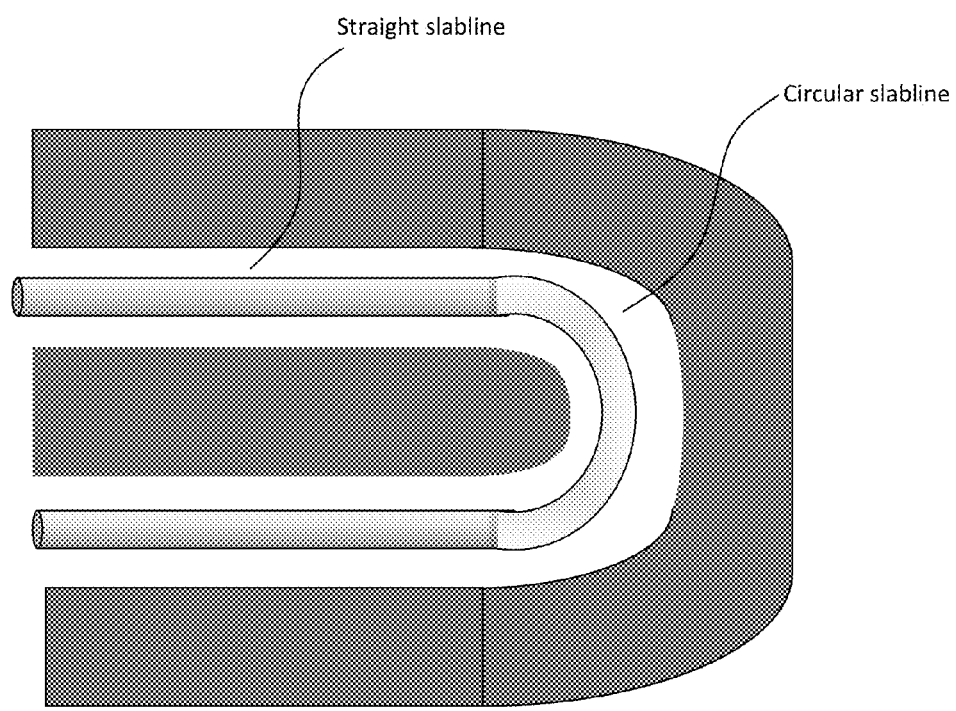
Figure 6: Bend in meandering slabline structure (top view)

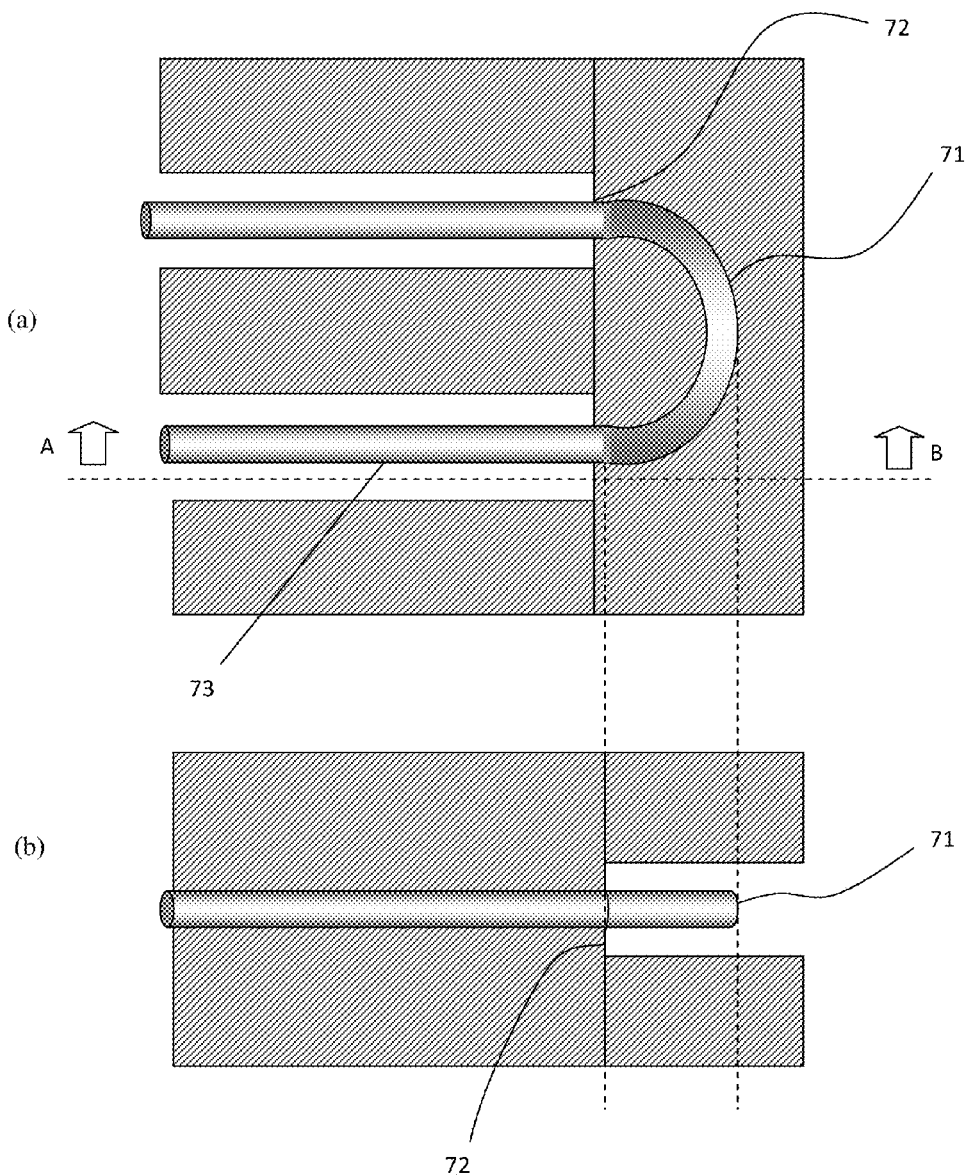
Figure 7: Vertical-Horizontal transition-bend in meandering slabline structure
(a) top view, (b) cross section A-B.

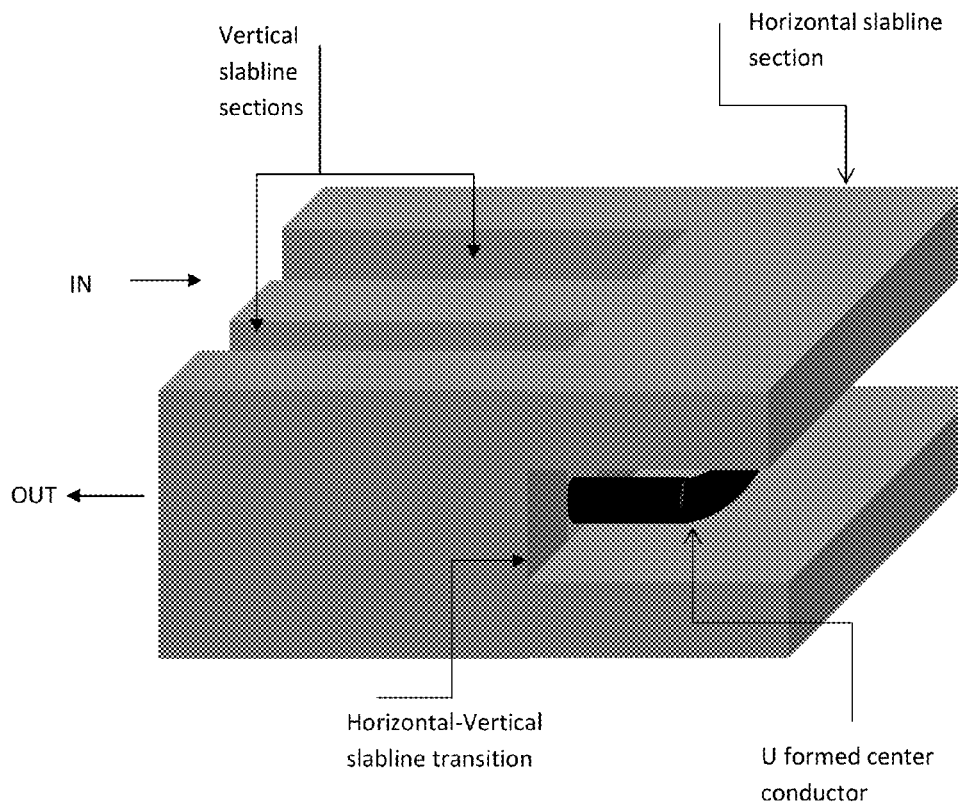
Figure 8: Vertical-Horizontal transition-bend in meandering slabline structure.

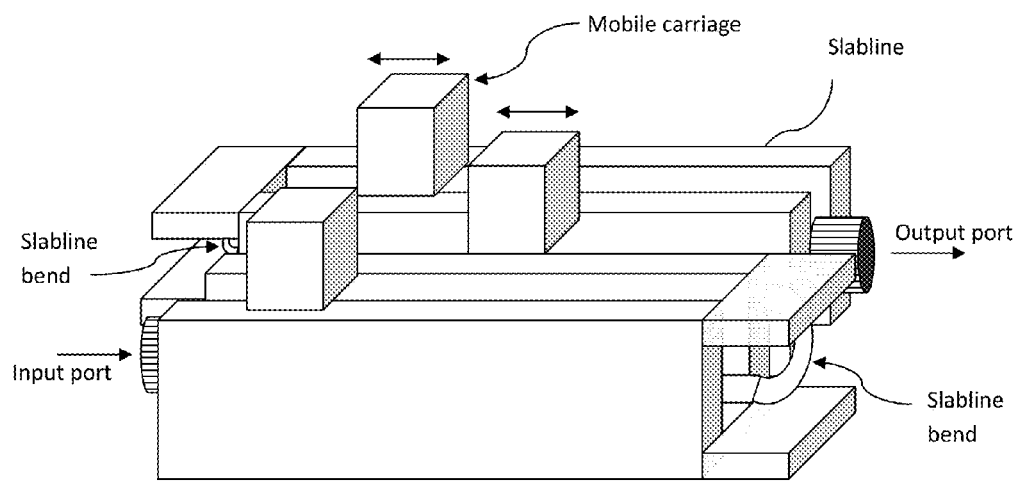
Figure 9: Meandering 3 carriage tuner.

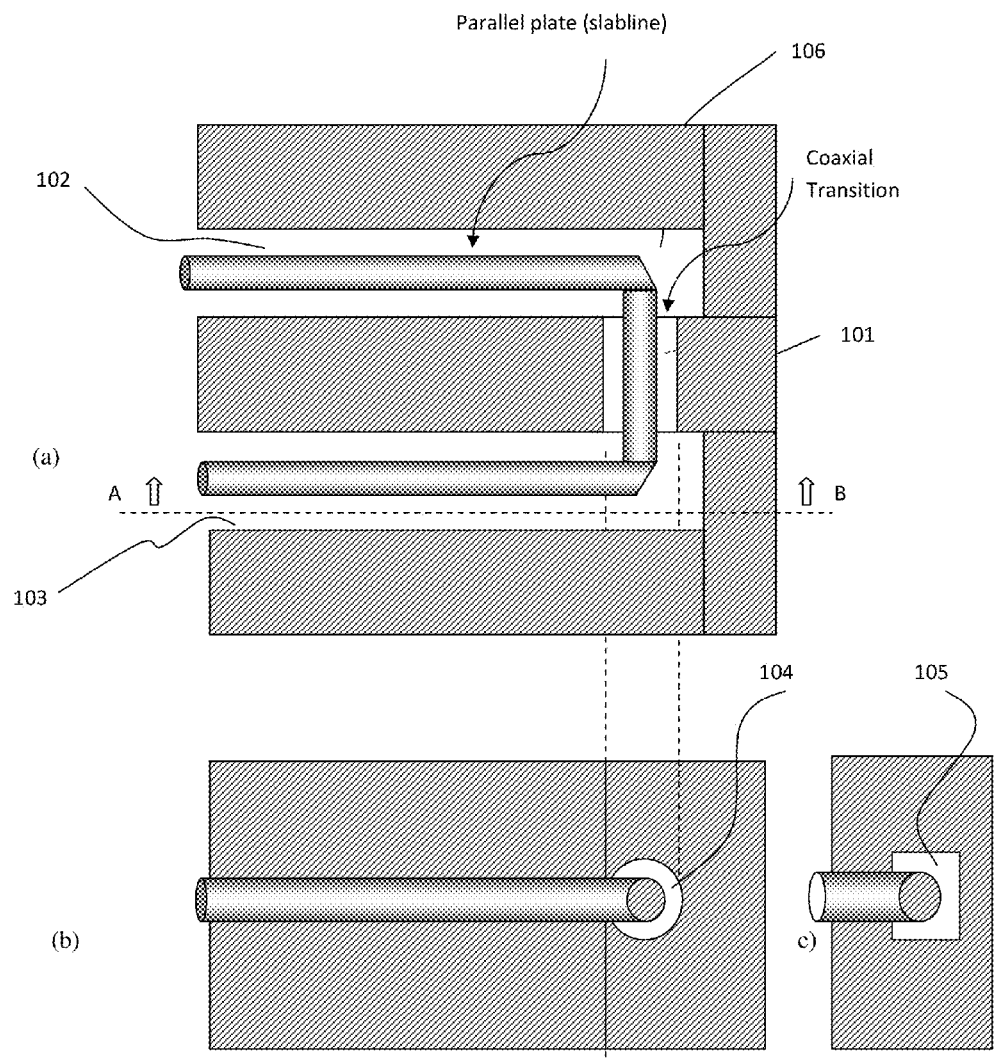
Figure 10: Coaxial transition-bend in serpentine slabline structure; b) cylindrical transition, c) rectangular transition

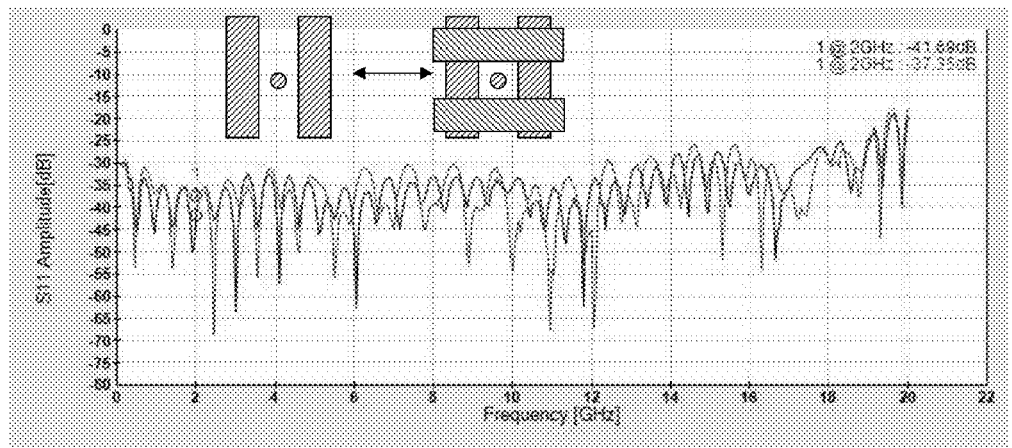
Figure 11: Effect of 90 degree rotation of half a slabline on reflection factor (S11)
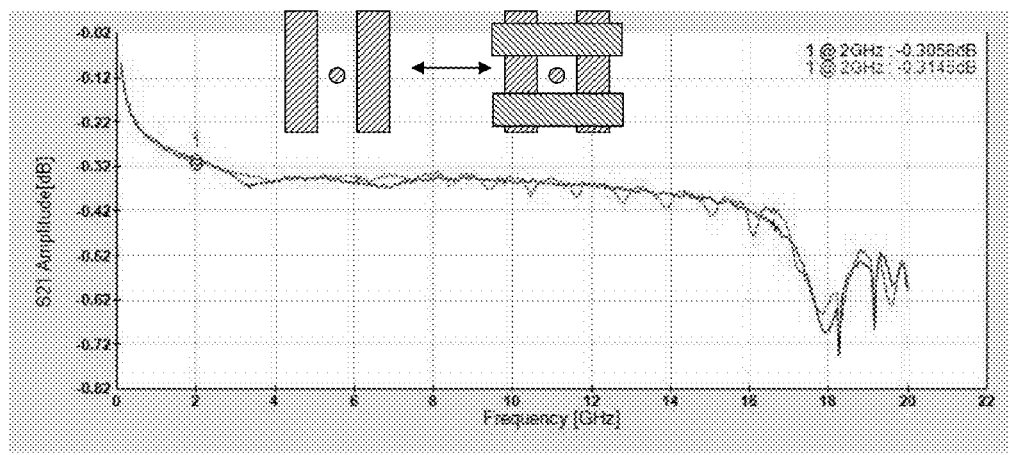
Figure 12: Effect of 90 degree rotation of half a slabline on transmission factor (S21)

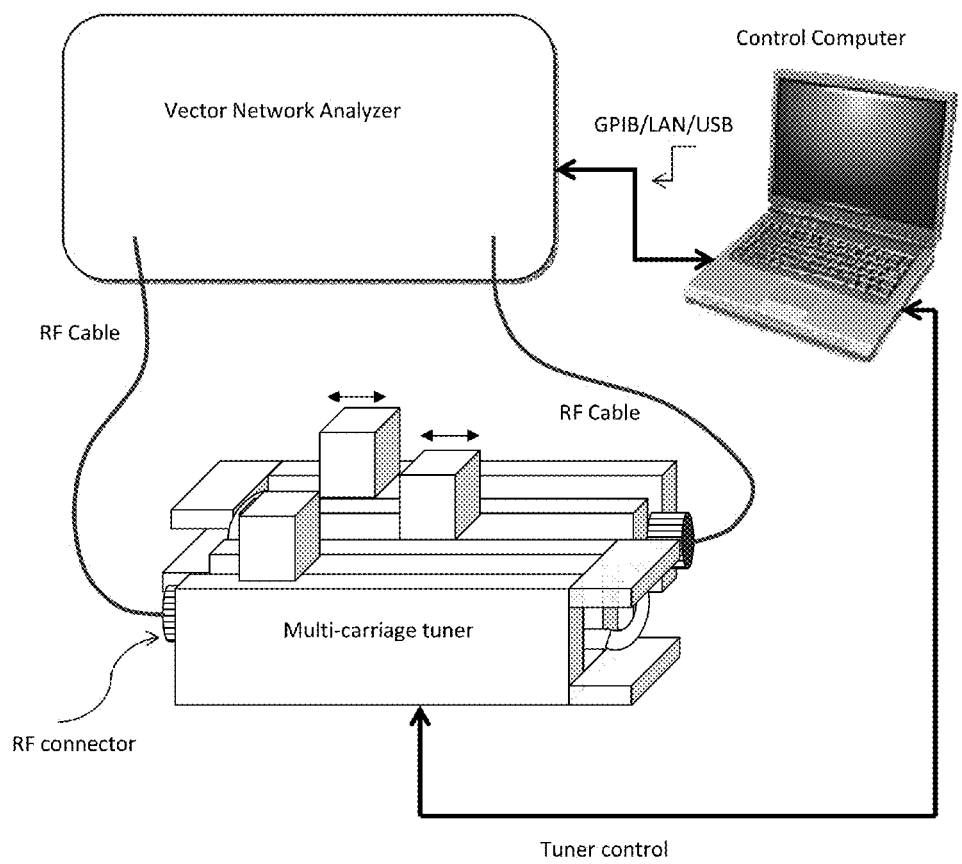
Figure 13: Tuner Calibration setup

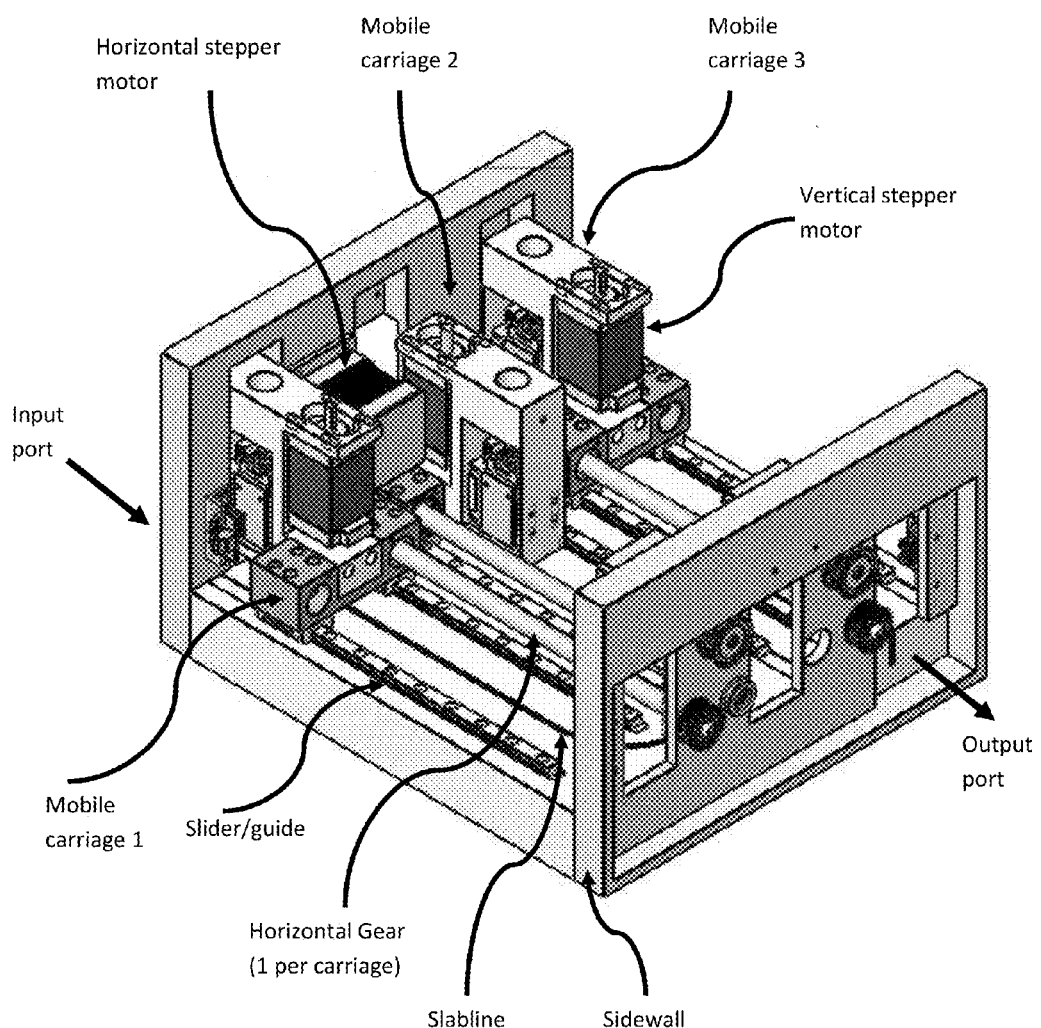
Figure 14: Short three carriage impedance tuner, minimum frequency = 1.8GHz

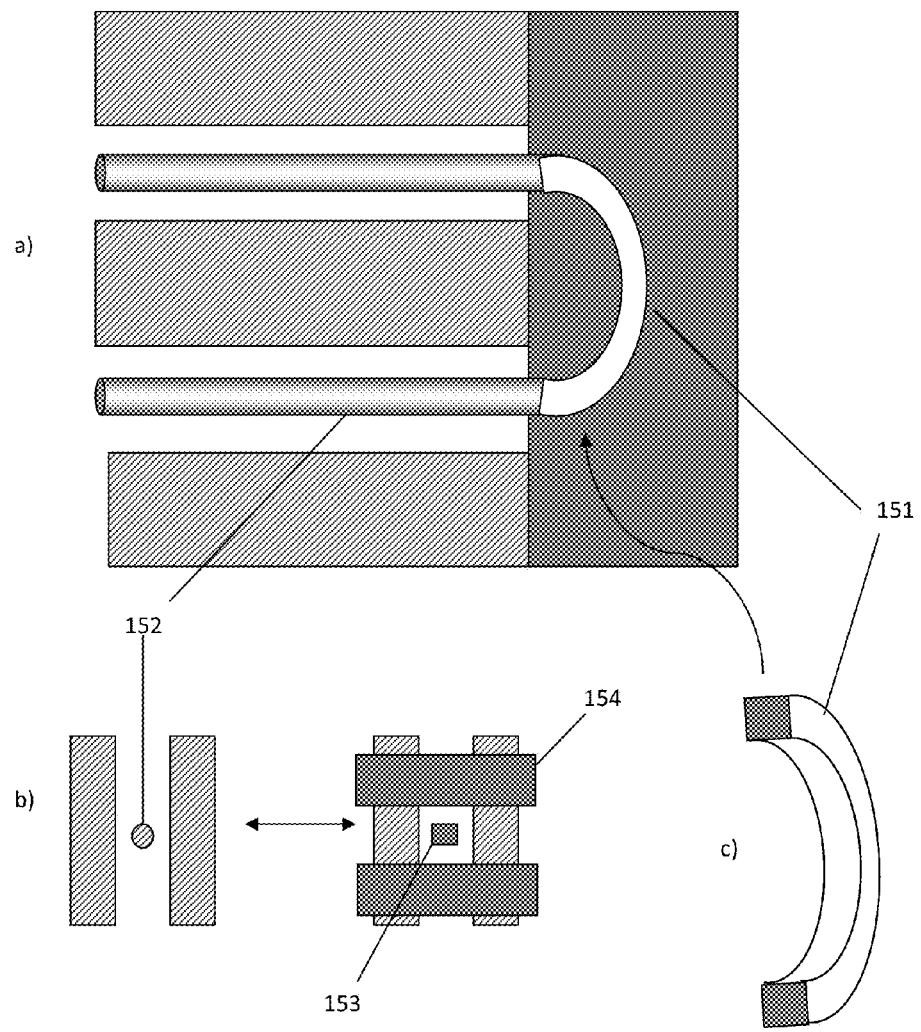
Figure 15: Slabline with round straight and rectangular bend (c) center conductor

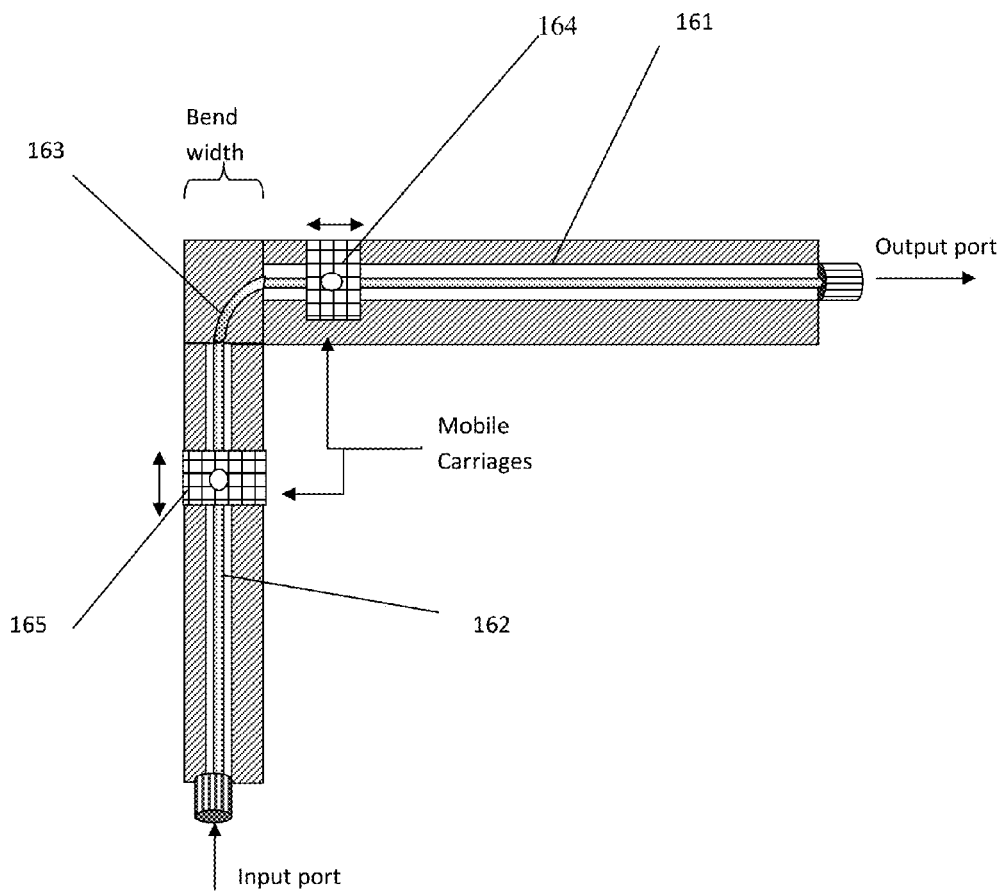
Figure 16: Short two-carriage tuner using 90 degree angled slabline

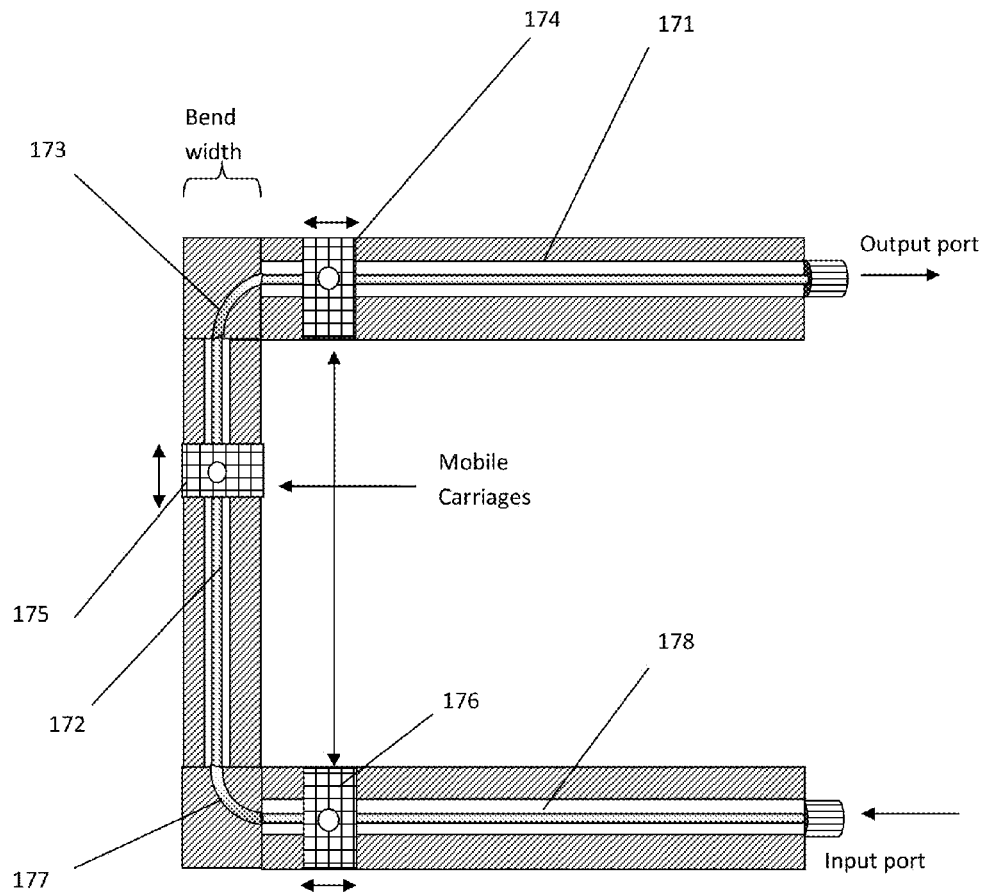
Figure 17: Short tuner using rectangular slabline pattern

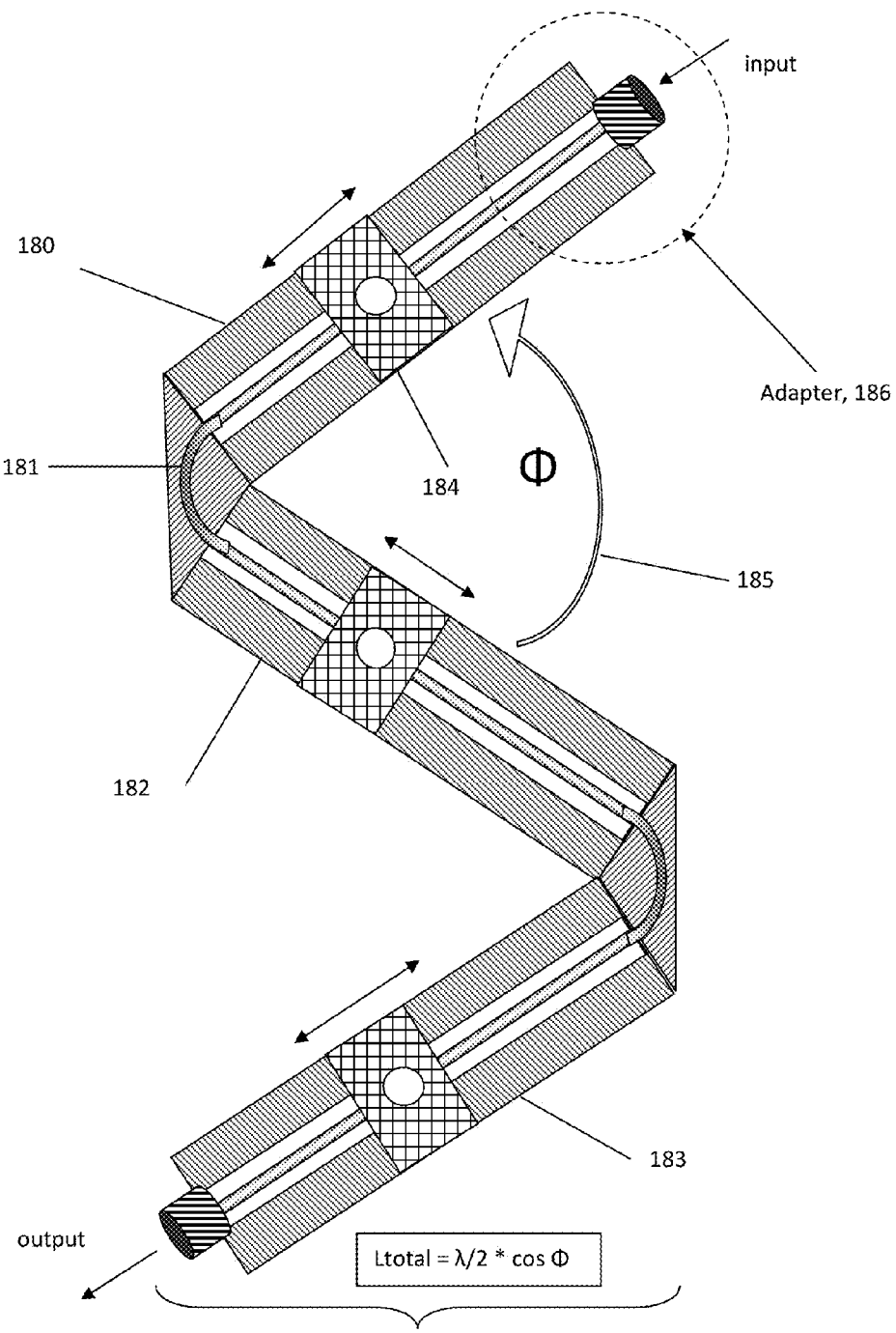
Figure 18: Short 3 carriage tuner trading shorter length against higher depth.

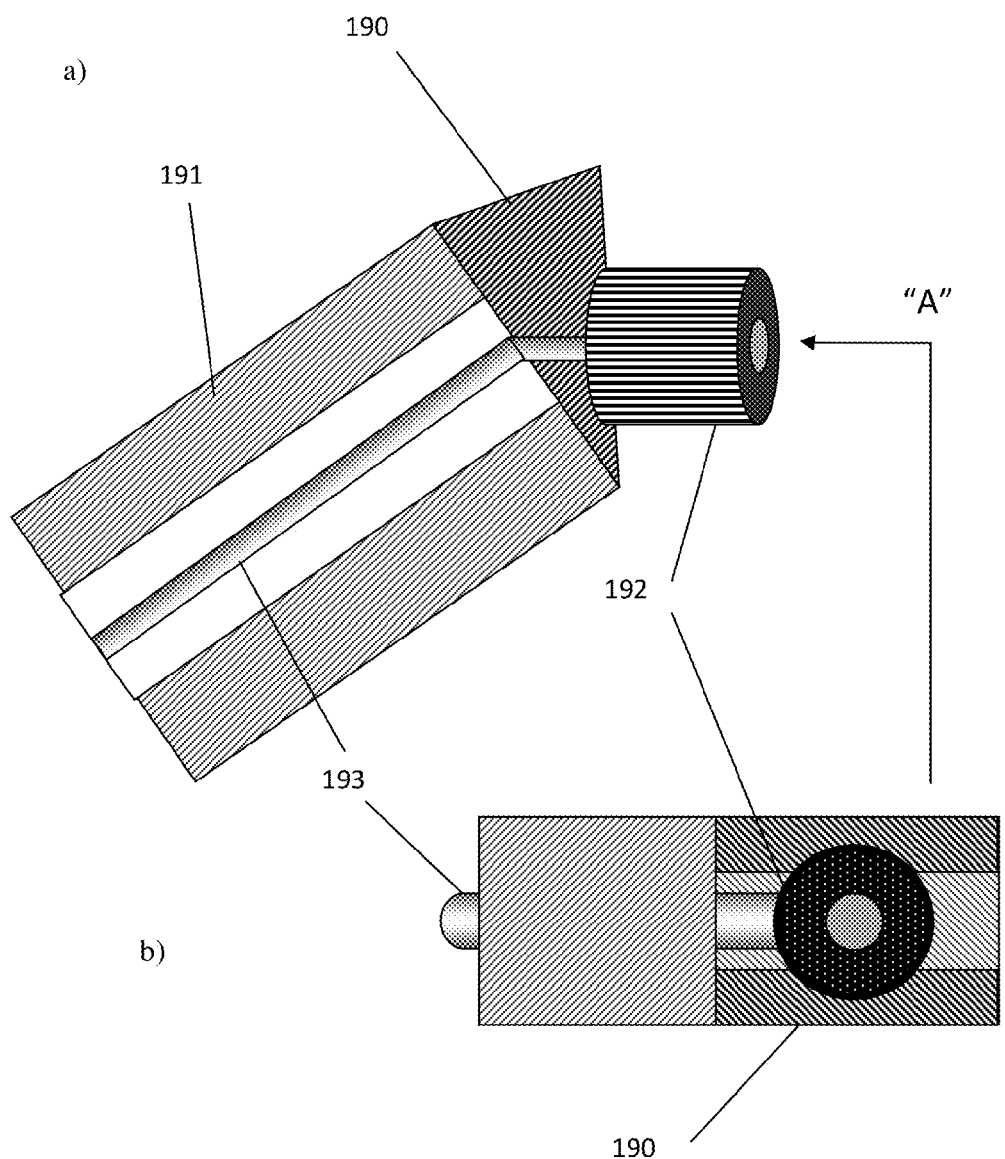
Figure 19: Angled coax-slabline adapter using vertical-horizontal transition

MECHANICALLY SHORT MULTI-CARRIAGE TUNER

PRIORITY CLAIM

This application refers to provisional application 61/670,892 filed on Jul. 12, 2012

CROSS-REFERENCE TO RELATED ARTICLES

[1] Load Pull System: http://www.microwaves101.com/encyclopedia/loadpull.cfm
[2] "Computer Controlled Microwave Tuner—CCMT", Product Note 41, Focus Microwaves, January 1998
[3] Directional Couplers: http://www.e-rneca.com/rf-directional-coupleridirectional-coupler-780.php
[4] U.S. Pat. No. 7,135,941 Triple probe automatic slide screw load pull tuner and method
[5] "MPT, a universal Multi-Purpose Tuner", Product Note 79, Focus Microwaves, October 2004
[6] S-parameter Basics: http://www.microwaves101.com/encyclopedia/sparameters.cfm,
[7] "Integrated (MPT) versus Cascaded-Tuner Harmonic Tuning", Focus Microwaves Inc., Product Catalogue 2013, Pages 104-105
[8] U.S. Pat. No. 6,297,649 Harmonic rejection load tuner
[9] U.S. Pat. No. 6,674,293 Adaptable pre-matched tuner system and method
[10] "High Resolution Tuners Eliminate Load Pull Performance Errors", Application Note 15, Focus Microwaves, January 1995

BACKGROUND OF THE INVENTION

Prior Art

This invention relates to low noise and high power (non-linear) testing of microwave transistors (DUT) in the frequency and time domain for Noise and Load Pull measurements [1]. Load pull is the method by which the load impedance presented to the DUT at a given frequency is changed systematically and the DUT performance is registered, with the objective to find an optimum depending on the overall design objectives [1]. This may be maximum power, efficiency, linearity or else. The same is valid for the source side of the DUT. Passive (slide screw) tuners are used to emulate the various impedances presented to the DUT [2], (FIG. 1). The electrical signals injected into the input of the DUT and extracted from the output can be measured using sampling devices, such as signal couplers [3]. At high power the (nonlinear) DUT is saturating and deforming the sinusoidal input signal. As a result part of the power is contained in harmonic frequency components. The DUT performance can only be optimized when all harmonic frequency components are impedance-matched properly. This requires independent harmonic tuning, mainly at the DUT output, but also at the DUT input.

In the case of noise measurements the tuners are used to generate arbitrary source impedances and appropriate software is then used to extract the noise parameters. In all cases the length of the tuners at low frequencies is a mechanically limiting factor.

Harmonic impedance tuners have been introduced in 1999 [8] and 2004 [4, 5]. The early versions [8] used resonant probes that need replacing for changing frequencies and allow tuning only at maximum Gamma ($\Gamma \approx 1$); in many cases this is sufficient, but in general it is a limitation. Recent harmonic tuners [4, 5] allow frequency agility and full Smith Chart coverage, but at the cost of higher mechanical complexity. Their accuracy is equal to or better than previous versions. They comprise a number of independent wideband probes (31) insertable and movable horizontally inside the slot of a low loss transmission airline (slabline) (32). To tune independently three frequencies, harmonic or not, it has been shown experimentally, that there is need for three such probes (31) [5]. Each probe is attached to and positioned by a precision remotely controlled gear mechanism in a carriage (33) (FIGS. 2 to 4). The main shortcoming of such tuners [5] is their horizontal size due to the length of the slabline. In order to generate arbitrary reflection factors (impedances) at any frequency, each probe and associated carriage must move horizontally over one approximately one half of a wavelength (112) at the fundamental frequency Fo (FIG. 3). Mechanically speaking, the lowest fundamental frequency determines the length of the tuner; the electrical wave length in air is $$\lambda[cm]=30/\text{Frequency [GHz]}.$$

In a practical tuner apparatus (FIGS. 2, 3, 14) the size of additional supporting items, such as the Length of the mobile Carriages themselves (LC) and the Length of the side-Walls (LW) of the tuner housing, add to the overall tuner length. In practical terms the minimum overall length of the slabline of a three carriage harmonic tuner, without the size of the input and output connectors, is:

$$L=3*\lambda/2+3*\text{carriage}(LC)+2*\text{side-walls}(LW)(\text{FIG. 3}).$$

The present invention describes a technique allowing reducing the overall linear length of such a tuner without affecting its RF performance; because of the fixed lengths of the carriages (LC) and sidewalls (LW) the overall tuner length reduction ratio obviously depends on the lowest frequency; because it is at the lowest frequency where the electrical length is largest and the proportion of the required horizontal effective carriage travel distance ($3*\lambda/2$) versus the size of the carriages and the side-walls is largest is well. For example, considering a typical width (LC) of a carriage being LC=3 cm and the thickness of each side-wall being LW=1 cm, then a three-carriage tuner starting at a lowest frequency of 400 MHz (0.4 GHz) has a size of L=3*15/0.4+3*3+2*1=3*37.5+9+2=123.5 cm. Using the new technique such a tuner can be reduced to an overall length of approximately 50 cm (linear length reduction factor $\approx 2.5$). If the lowest frequency is 2 GHz ($\lambda$=15 cm) the total actual tuner length is 33.5 cm; using the new technique this would become around 20 cm, a reduction ratio of $\approx 1.67$. So, it is obvious that the significance of the new method in reducing the overall length of the tuners is highest at the low frequencies, especially below 1 GHz.

BRIEF DESCRIPTION OF THE DRAWINGS

The invention and its mode of operation will be better understood from the following detailed description when read when read with the appended drawings in which:

FIG. 1 depicts prior art, a typical Load Pull measurement setup.

FIG. 2 depicts prior art, photograph of an actual three carriage harmonic tuner (Fmin=0.7 GHz), total length 38" (96.5 cm).

FIG. 3 depicts prior art, components and total length of three carriage tuner, abbreviations used: LC=carriage, LW=wall.

FIG. 4 depicts prior art, photograph of the internal mechanism of an actual three carriage tuner, minimum frequency=4 GHz.

FIG. 5 depicts a schematic top view of a three carriage tuner using a meandering slabline.

FIG. 6 depicts a top view of a bend in a meandering slabline structure.

FIG. 7 depicts views of a "vertical-horizontal" transition-bend in meandering slabline structure (a) top view, (b) cross section A-B.

FIG. 8 depicts perspective view of a "vertical-horizontal" transition-bend in meandering slabline structure.

FIG. 9 depicts perspective view of three carriage tuner using "vertical-horizontal" bends of the slabline.

FIG. 10 depicts coaxial transition-bend for a meandering (serpentine) slabline structure; b) cylindrical transition, c) rectangular transition iris.

FIG. 11 depicts effect of 90 degree axial rotation of half a slabline versus the other half on reflection factor (S11).

FIG. 12 depicts effect of 90 degree axial rotation of half a slabline versus the other half on transmission factor (S21).

FIG. 13 depicts a typical tuner calibration setup.

FIG. 14 depicts a perspective view of a short three carriage impedance tuner using a meandering slabline; minimum frequency=1.8 GHz.

FIG. 15 depicts views (a) of a slabline bend using round straight center conductor (b) and rectangular bend (c) center conductor.

FIG. 16 depicts short two-carriage tuner using 90 degree angled slabline and vertical-horizontal bend.

FIG. 17 depicts short three-carriage tuner using rectangular slabline pattern and two vertical-horizontal bends.

FIG. 18 depicts short three-carriage tuner trading shorter length versus higher depth.

FIG. 19 depicts angled coax-slabline adapter using vertical-horizontal transition.

DETAILED DESCRIPTION OF THE INVENTION

The invention discloses the concept of a mechanically short multi-carriage impedance tuner, based on a "meandering" or "serpentine" low loss slotted airline (slabline), (FIG. 5). The slabline comprises two or more straight sections (53), in which mobile carriages (54) are mounted, said carriages carrying metallic RF probes (slugs) (31) which are attached to vertical axes (55), positioned, remotely controlled and movable vertically towards the center conductor or horizontally along the axis of the slabline. Each section behaves as a single probe wideband impedance tuner [2] whereas the cascade of the sections behaves as a multi-carriage multi-probe harmonic tuner [5].

Each carriage (54) rides on a slider to guide it parallel to the slot (53) and center conductor of the slabline and a gear to move it in the same direction. All those partial components are identified in a schematic presentation of such a new tuner apparatus in FIG. 14 as well in a prior art tuner in FIG. 4. Said gear is connected mechanically through a belt or rack and pinion mechanism to a stepper motor, which is electrically and remotely controlled by a controller and associated firmware. Each carriage also comprises a precision vertical axis, also controlled by a stepper motor, which positions the RF probe (slug) (31) in controlled distance from the center conductor of the slabline in order to create controlled reflection (FIG. 4).

In the serpentine multi-section tuner (FIG. 5) the mobile carriage mechanism is essentially the same as prior art (FIG. 4); but the carriages are not placed "in line". Instead they travel "in parallel" in the parallel straight sections (53) of the slabline. The carriages themselves are in fact simpler to make, since each has to carry provision for a single horizontal drive gear only (FIG. 14) and not two or three as in a cascade configuration (FIG. 4).

The key advantage of the new structure compared with the original multi-carriage tuner is the actual linear length of the slabline; this simplifies manufacturing accuracy and integration on wafer probe stations. In order to reverse the direction of the signal the slabline must include bend-sections (51, 52). These bend-sections must be both extremely low loss and low reflection, since any insertion loss between tuning sections will reduce the tuning range (maximum reflection factor) of the tuner and any non-negligible reflection will shift the tuning vector of the following section as a function of frequency in an un-controllable manner [7]; this last phenomenon may reduce the efficiency of the tuning algorithms, as well as the tuning range. For instance, it has been shown that it is a poor alternative to use two or three sections of straight slabline and inter-connect those using flexible or semi-rigid coaxial cables [7]. Such cables require connectors at the slabline ends and produce insertion loss and residual reflection. In this case, even if the tuning mechanism is basically the same, the performance is marginal and does not represent a viable solution.

Therefore special attention must be paid in designing the slabline bends. This invention discloses four alternatives for such low loss—low reflection bends; (a) one uses a U bend center conductor of the straight slabline in a configuration here named "vertical-horizontal slabline transition" (FIGS. 7, 8 and 15), (b) one uses said vertical-horizontal slabline bend with a center conductor with rectangular cross section (FIG. 15*c*), (c) one uses a semi-circular vertical slabline section with a cylindrical center conductor (FIG. 6) and (d) one uses a coaxial section traversed by a straight center conductor attached at 90 degrees (106) to the center conductor of the straight slabline (FIG. 10). The coaxial section (101) joining the two straight slabline sections (102, 103) in FIG. 10 can have the form of a cylindrical (104) or rectangular (105) cavity.

This concept of low loss low reflection bends connecting adjacent sections of straight slabline can, of course, be applied to structures where the straight sections are not parallel, being disposed at angles such as 0, 45, 60 or 90 degrees or similar (FIGS. 5, 17, 18) depending on the desired overall configuration.

From the four bend section configurations described above the easiest to make is the one shown in FIGS. 7, 8 and 15. This is the case because it is easy to manufacture and the transition between the vertical slabline and the horizontal slabline (72) does not deteriorate the insertion loss and residual reflection behavior of the straight slabline sections as shown by measured results in FIGS. 11, 12, and the exact form of the U-section (71) of the center conductor is not critical; in fact in a slabline only the distance between center conductor and sidewalls is a critical parameter, because the electric field is concentrated in this area. The structure in FIG. 6 is more difficult to make and control: the U-section of the center conductor must be perfectly made as must be the semi-circular slot in the slabline. Again the distance between center conductor and sidewalls must be precisely controlled and the fact of bending the center conductor creates a deformation of the electric field which requires special design and accurate manufacturing.

Alternatively to a cylindrical center conductor in the area of the slabline bend, a rectangular center conductor can be used (FIG. 15*c*); experimentally such transitions do not create a major difference in performance to the cylindrical version shown in FIGS. 7*a*-7*c*. The slight advantage of this configuration is that the U formed section (151) with rectangular profile can be machined with tighter tolerances than a cylindrical section (71) can be bent to exactly fit with the ends of the two straight center conductors (73, 152).

For these reasons the configuration of the vertical-horizontal slabline transition is a preferred solution (FIGS. 7, 8, 15). The structure has tested (FIGS. 11, 12). The two overlapping traces in those plots show residual reflection and insertion loss of a slabline connection when the plans are either 0 degrees (straight slabline) or 90 degrees (cross slabline) as a function of frequency (from 0.1 to 18 GHz). It is seen that in both cases the degradation is negligible.

FIG. 9 shows a perspective view of a short tuner using a meandering slabline and three carriages and vertical-horizontal slabline bend-sections.

The short tuner structure is not limited to using adjacent parallel sections of slabline. Sections perpendicular to each-other can be used as well, either for making two-carriage tuners (FIG. 16) or three-carriage tuners (FIG. 17). In a preferred embodiment these structures all employ the new idea of using vertical-horizontal low-loss low-reflection bend slabline structure. A vertical 90 degree slabline bend using the concept of FIG. 6 is also possible without broadening the scope of the invention. In FIG. 16 the horizontal slabline (161) is connected to the vertical one (162) using a 90 degree bend (163). The mobile carriages (164, 165) each carry a capacitive probe insertable into the slot of said slablines. The structure of FIG. 16 having two independent probes may be used as high reflection factor (pre-matching) or as two frequency (harmonic) tuner [9]. The structure of FIG. 17 employs, in addition to the components of FIG. 16, one more horizontal slabline (178) and mobile carriage (176) connected to the vertical slabline (172) using the 90 degree bend (177). This structure has multiple applications, being useable as high reflection, mechanically stable or three-frequency harmonic tuner [4, 5 and 9].

In FIGS. 3, 5, 9, 13, 16, 17 and 18 we show, for reasons of simplicity, only the concept and the main RF components of the short multi-carriage tuner (slablines, carriages and center conductors). The carriage control and the RF probes themselves are, in general, prior art and partly recognizable in figures (photos) 2 and 4 and schematically in FIG. 14. The prior art three-carriage tuner in FIG. 4 and of the new short three-carriage tuner in FIG. 14 have a similar length and share many components, but the FIG. 14 (short) tuner uses the meandering slabline structure; therefore the prior art tuner (FIG. 4) has a lowest frequency of operation of 4 GHz, whereas the new short tuner (FIG. 14) has a lowest frequency of operation of 1.8 GHz; this corresponds to a shortening factor of 2.2.

The overall length of a multi-carriage tuner can still be reduced using a "harmonica" kind of structure (FIG. 18), whereby the angle Φ (185) between straight slabline sections (180, 182 and 183) is approximately between 30 and 60 degrees. In this case the total length of the tuner body is $\lambda/2*\cos(\Phi)$. On each straight section of slabline there is one mobile carriage (184) and the straight sections are connected using low-loss bends (181). The limitation of this configuration is the increased depth of the tuner body which is proportional to $\sin(\Phi)$. A particularity of this structure is that the coaxial end adapter (186) protrudes from the slabline under the angle Φ. This can be corrected as shown in FIG. 19. Hereby the center conductor (193) of the slabline (191) is bent and traverses a vertical-horizontal bend section (190) to enter the coaxial connector (192). Obviously the bents (190) can also be made using coaxial or slabline structures as shown in FIG. 6 or 10.

The multi-carriage tuner is calibrated by connecting it to a pre-calibrated vector network analyzer using flexible RF cables (FIG. 13) and controlling both, the network analyzer and the tuner using a system or control computer. The tuner probes are positioned at a number of pre-determined states and two-port scattering parameters (S-parameters) [6] are measured by the network analyzer. The S-parameters of all sections, except one, are de-embedded by the S-parameters of the "tuner box" (=initialized tuner=all probes withdrawn from the slabline) and saved in temporary or permanent computer memory before de-embedding from S-parameter data of the individual tuner probes, to create the complete tuner calibration data [5]. The calibration data is then used to create user defined impedances ("tuning") when the tuner is used in a test setup [1], FIG. 1, by efficient search algorithms targeting a minimum vector difference between the target reflection factors and the calibrated data points and associated interpolated points between said calibrated ones [10, pages 6 and 7].

This invention discloses mechanically short multi-carriage tuners using a meandering or serpentine slabline. The critical issue of slabline bends is addressed with four low loss, low reflection alternatives. A preferred embodiment comprises a vertical-horizontal slabline transition. Cable inter-connections between straight slabline sections are possible but in effect discarded because they create marginal tuner performance due to relatively high reflections and insertion loss. Obvious alternatives of low loss bend sections between straight slabline sections shall not impede on the validity of the disclosed invention.

I claim:

1. A method for making meandering low loss, low reflection airlines comprising straight slotted sections (slablines) and coaxial transition sections to adjacent straight slabline sections, said coaxial transition sections comprising a metallic wall separating said straight sections and an opening (iris) on said wall between said sections.

2. A method as in claim 1 wherein a straight section of center conductor attaches at the ends of the center conductors of said straight slabline sections and traverses the said opening (iris) between the two straight sections, said opening and associated center conductor forming a transmission line with characteristic impedance Zo approximately equal to the characteristic impedance of the straight sections of said slabline.

3. A method as in claim 2 wherein said opening (iris) is circular.

4. A method as in claim 2 wherein said opening (iris) in rectangular.

5. A method for making short multi-carriage electromechanical impedance tuners using meandering low loss airlines,
   said airlines comprising cascades of straight slotted airline (slabline) sections and low-loss low-reflection bend airline sections,
   said tuners comprising an input port and an output port and said meandering airline between said ports,
   said airline comprising at least two distinct straight slabline sections which are cascaded using said bend airline sections,
   and one or more remotely controlled mobile carriage(s) associated with and sliding along the axis of each said straight section of said slabline,
   each said carriage comprising a vertical axis on which a conductive RF probe is attached, wherein said probe can slide horizontally and vertically inside the slot of said slabline and create controlled reflection factor by capacitive coupling with the centerconductor of said slabline.

6. A tuner as in claim 5, wherein said airline comprises two straight slabline sections cascaded using one bend section.

7. A tuner as in claim 5, wherein said airline comprises three straight slabline sections cascaded using two bend sections.

8. A method as in claim 6 or 7 wherein said bend airline sections are slablines whose planes are tilted axially perpendicular to the plane of said straight sections,
said slabline bend sections comprising a top and a bottom sidewall placed above each other at a distance between them similar to the distance between the vertical sidewalls of the straight section(s)
and a semi-circular center conductor placed between said top and bottom sidewall at such distance from each sidewall of said bend sections as to create a characteristic standard impedance Zo.

9. A tuner as in claim 6 or 7, wherein the axes of the straight slabline sections are parallel to each-other.

10. A tuner as in claim 6 or 7, wherein the axes of the straight slabline sections are perpendicular to each-other.

11. A tuner as in claim 6 or 7, wherein the characteristic impedances of the straight and bend sections of said meandering slabline are approximately equal.

12. A tuner as in claim 6 or 7, wherein the bend sections of said meandering slabline are coaxial.

13. A tuner as in claim 6 or 7, wherein the bend sections of said meandering slabline are semi-circular slablines.

14. A tuner as in claim 6 or 7, wherein the bend sections of said meandering slabline comprise vertical-horizontal slabline transitions.

15. A tuner as in claim 14, wherein the cross section of the center conductors of the bend sections of said meandering slabline is rectangular.

16. A tuner as in claim 6 or 7, wherein said straight slabline sections comprise two parallel side walls and a cylindrical center conductor forming together a transmission line with standard characteristic impedance Zo.

17. A tuner as in claim 16, whereby said center conductor has a rectangular cross-section.

18. A method as in claim 6 or 7 wherein said bend airline sections are vertically slotted and comprise a curved slot and a curved center conductor positioned concentrically inside said slot in a manner as to maintain continuity of the characteristic impedance Zo of the straight slabline sections.

19. A method as in claim 18 whereby the axes of said curved slot and center conductor are semi-circular.

20. A method as in claim 18 whereby the axes of said curved slot and center conductor are quarter-circular.

* * * * *